United States Patent
Mollat et al.

(10) Patent No.: US 12,464,761 B2
(45) Date of Patent: Nov. 4, 2025

(54) LOCOS FILLET FOR DRAIN REDUCED BREAKDOWN IN HIGH VOLTAGE TRANSISTORS

(71) Applicant: TEXAS INSTRUMENTS INCORPORATED, Dallas, TX (US)

(72) Inventors: Martin B. Mollat, Gainesville, TX (US); Henry L. Edwards, Garland, TX (US); Alexei Sadovnikov, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 426 days.

(21) Appl. No.: 18/072,201

(22) Filed: Nov. 30, 2022

(65) Prior Publication Data

US 2024/0178318 A1    May 30, 2024

(51) Int. Cl.
  *H10D 30/01*    (2025.01)
  *H01L 21/762*   (2006.01)
  *H10D 30/60*    (2025.01)
  *H10D 30/65*    (2025.01)
  *H10D 64/00*    (2025.01)
  (Continued)

(52) U.S. Cl.
  CPC ..... *H10D 30/603* (2025.01); *H01L 21/76202* (2013.01); *H10D 30/0221* (2025.01); *H10D 30/65* (2025.01); *H10D 64/111* (2025.01); *H10D 64/112* (2025.01); *H10D 84/017* (2025.01); *H10D 84/038* (2025.01); *H10D 30/601* (2025.01)

(58) Field of Classification Search
  CPC ........ H10D 62/108; H10D 8/00; H10D 8/024; H10D 8/411; H10D 62/115; H10D 62/126; H10D 62/128; H10D 62/129; H10D 64/112; H10D 89/611; H10D 8/043; H10D 64/111–117; H10D 62/109–111; H10D 30/601–608; H10D 84/933; H10D 64/115; H01L 21/76202–76221; H01L 21/76235
  See application file for complete search history.

(56) References Cited

U.S. PATENT DOCUMENTS

| | | | | |
|---|---|---|---|---|
| 5,510,275 A | * | 4/1996 | Malhi | H10D 30/6708 257/E29.081 |
| 5,576,230 A | * | 11/1996 | Guldi | H01L 21/266 438/303 |

(Continued)

*Primary Examiner* — Maliheh Malek
(74) *Attorney, Agent, or Firm* — Andrew R. Ralston; Frank D. Cimino

(57) ABSTRACT

An integrated circuit includes a source region and a drain region spaced apart and extending into a semiconductor layer. A gate electrode extends between the source and the drain regions, and a dielectric layer is between the gate electrode and the semiconductor layer. The dielectric layer includes a first portion having a first thickness and a second portion having a second greater second thickness and a lateral perimeter surrounding the source region. The lateral perimeter includes a first edge having a first linear segment extending between the source region and the drain region along a first direction and a second edge having a second linear segment extending over the semiconductor layer along a different second direction. A fillet of the second portion connects the first linear segment and the second linear segment of the lateral perimeter.

18 Claims, 18 Drawing Sheets

(51) Int. Cl.
*H10D 84/01* (2025.01)
*H10D 84/03* (2025.01)

(56) References Cited

U.S. PATENT DOCUMENTS

| | | | | |
|---|---|---|---|---|
| 5,969,387 | A * | 10/1999 | Letavic | H10D 30/657 |
| | | | | 257/E29.279 |
| 6,023,090 | A * | 2/2000 | Letavic | H10D 30/657 |
| | | | | 257/E29.279 |
| 6,063,674 | A * | 5/2000 | Yang | H10D 62/371 |
| | | | | 438/297 |
| 6,064,086 | A * | 5/2000 | Nakagawa | H10D 12/01 |
| | | | | 257/E29.199 |
| 6,160,290 | A * | 12/2000 | Pendharkar | H10D 30/668 |
| | | | | 257/493 |
| 6,211,552 | B1 * | 4/2001 | Efland | H10D 30/0221 |
| | | | | 257/338 |
| 6,424,005 | B1 * | 7/2002 | Tsai | H10D 30/65 |
| | | | | 257/283 |
| 6,483,149 | B1 * | 11/2002 | Mosher | H10D 30/603 |
| | | | | 257/E29.268 |
| 6,531,355 | B2 * | 3/2003 | Mosher | H10D 30/0221 |
| | | | | 257/E29.268 |
| 6,593,621 | B2 * | 7/2003 | Tsuchiko | H10D 30/65 |
| | | | | 257/E29.066 |
| 6,670,685 | B2 * | 12/2003 | Pendharkar | H10D 30/0221 |
| | | | | 257/E29.054 |
| 6,911,696 | B2 * | 6/2005 | Denison | H10D 30/64 |
| | | | | 257/E29.066 |
| 7,005,351 | B2 * | 2/2006 | Henninger | H10D 64/117 |
| | | | | 257/E29.136 |
| 7,187,033 | B2 * | 3/2007 | Pendharkar | H10D 84/811 |
| | | | | 257/342 |
| 7,498,652 | B2 * | 3/2009 | Pan | H10D 62/151 |
| | | | | 257/492 |
| 8,017,486 | B2 * | 9/2011 | Huang | H10D 30/0221 |
| | | | | 438/296 |
| 8,283,747 | B2 * | 10/2012 | Tanaka | H10D 10/421 |
| | | | | 257/500 |
| 8,319,255 | B2 * | 11/2012 | Vashchenko | H10D 18/251 |
| | | | | 257/341 |
| 8,581,344 | B2 * | 11/2013 | Liu | H10D 62/151 |
| | | | | 257/E29.255 |
| 8,907,424 | B2 * | 12/2014 | Fujita | H10D 89/60 |
| | | | | 438/270 |
| 9,570,437 | B2 * | 2/2017 | Boos | H10D 84/121 |
| 9,583,612 | B1 * | 2/2017 | Edwards | H10D 84/013 |
| 9,741,718 | B2 * | 8/2017 | Hu | H10D 30/603 |
| 10,529,804 | B2 * | 1/2020 | Cai | H10D 62/109 |
| 10,529,812 | B1 * | 1/2020 | Edwards | H10D 64/516 |
| 10,714,474 | B2 * | 7/2020 | Hu | H10D 64/514 |
| 10,910,472 | B2 * | 2/2021 | Cai | H10D 62/393 |
| 10,957,774 | B2 * | 3/2021 | Pendharkar | H10D 62/116 |
| 11,031,497 | B2 * | 6/2021 | Wang | H10D 30/0221 |
| 11,101,345 | B2 * | 8/2021 | Murasaki | H10D 30/668 |
| 11,107,913 | B2 * | 8/2021 | Hoshi | H10D 62/8325 |
| 11,251,276 | B2 * | 2/2022 | Wang | H10D 62/393 |
| 11,362,208 | B2 * | 6/2022 | Kawai | H10D 30/603 |
| 11,387,333 | B2 * | 7/2022 | Edwards | H10D 30/603 |
| 11,488,923 | B2 * | 11/2022 | Joo | H01L 24/03 |
| 12,327,829 | B2 * | 6/2025 | Naquin | H10D 30/0285 |
| 2003/0181010 | A1 | 9/2003 | Blanchard | H10D 30/0291 |
| | | | | 257/E21.418 |
| 2004/0031987 | A1 * | 2/2004 | Henninger | H10D 64/117 |
| | | | | 257/493 |
| 2004/0108544 | A1 * | 6/2004 | Hossain | H10D 62/157 |
| | | | | 257/E29.054 |
| 2005/0073007 | A1 * | 4/2005 | Chen | H10D 30/603 |
| | | | | 257/E29.268 |
| 2006/0199344 | A1 * | 9/2006 | Tanaka | H10D 62/393 |
| | | | | 257/E29.066 |
| 2009/0267144 | A1 * | 10/2009 | Kobayashi | H10D 62/393 |
| | | | | 257/E29.256 |
| 2010/0052091 | A1 * | 3/2010 | Tanaka | H10D 84/0144 |
| | | | | 257/501 |
| 2010/0065903 | A1 * | 3/2010 | Parthasarathy | H10D 30/66 |
| | | | | 257/E47.001 |
| 2011/0121386 | A1 * | 5/2011 | Hsieh | H10B 41/42 |
| | | | | 257/334 |
| 2015/0187957 | A1 * | 7/2015 | Ding | H10D 84/0144 |
| | | | | 438/197 |
| 2015/0194421 | A1 * | 7/2015 | Boos | H10D 86/01 |
| | | | | 257/370 |
| 2015/0249126 | A1 * | 9/2015 | Kataoka | H10D 62/116 |
| | | | | 257/343 |
| 2017/0301673 | A1 * | 10/2017 | Hu | H10D 62/393 |
| 2018/0026102 | A1 * | 1/2018 | Gammon | H10D 12/411 |
| | | | | 257/77 |
| 2018/0174887 | A1 * | 6/2018 | Chuang | H10D 62/393 |
| 2019/0058039 | A1 * | 2/2019 | Cai | H01L 21/761 |
| 2020/0091282 | A1 * | 3/2020 | Murasaki | H10D 12/032 |
| 2020/0144413 | A1 * | 5/2020 | Sadovnikov | H10D 30/0281 |
| 2020/0152788 | A1 * | 5/2020 | Kocon | H01L 21/76202 |
| 2020/0161457 | A1 * | 5/2020 | Takahashi | H01L 21/322 |
| 2020/0258987 | A1 * | 8/2020 | Chuang | H01L 21/3085 |
| 2020/0287045 | A1 * | 9/2020 | Kawai | H10D 30/65 |
| 2020/0295182 | A1 * | 9/2020 | Hoshi | H10D 62/8325 |
| 2020/0373270 | A1 * | 11/2020 | Joo | H01L 24/03 |
| 2021/0074839 | A1 * | 3/2021 | Haynie | H10D 62/157 |
| 2021/0104514 | A1 * | 4/2021 | Kocon | H10D 89/713 |
| 2022/0052165 | A1 * | 2/2022 | Ma | H10D 30/63 |
| 2022/0149186 | A1 * | 5/2022 | Edwards | H10D 62/156 |
| 2023/0126337 | A1 * | 4/2023 | Kim | H02M 1/08 |
| | | | | 257/438 |
| 2023/0187498 | A1 * | 6/2023 | Umeki | H10D 62/128 |
| | | | | 257/327 |
| 2023/0207666 | A1 * | 6/2023 | Wang | H10D 30/0281 |
| 2023/0238458 | A1 * | 7/2023 | Xu | H10D 1/66 |
| | | | | 257/340 |
| 2023/0343869 | A1 * | 10/2023 | Xu | H10D 30/65 |
| 2024/0006529 | A1 * | 1/2024 | Amethystna | H10D 30/603 |
| 2024/0258426 | A1 * | 8/2024 | Jung | H10D 30/0221 |
| 2024/0363720 | A1 * | 10/2024 | Edwards | H10D 30/65 |
| 2024/0363748 | A1 * | 10/2024 | Varghese | H10D 64/671 |
| 2024/0405519 | A1 * | 12/2024 | Clarke | H01T 1/02 |
| 2024/0421049 | A1 * | 12/2024 | Okamoto | H01L 24/73 |
| 2025/0006836 | A1 * | 1/2025 | Bauer | H10D 30/65 |
| 2025/0030237 | A1 * | 1/2025 | Clarke | H05K 1/0259 |
| 2025/0040179 | A1 * | 1/2025 | Mahalingam | H10D 30/0221 |
| 2025/0113585 | A1 * | 4/2025 | Edwards | H10D 30/65 |

\* cited by examiner

LOCOS FILLET FOR DRAIN REDUCED BREAKDOWN IN HIGH VOLTAGE TRANSISTORS

FIELD

This disclosure relates to the field of semiconductor manufacturing, and more particularly, but not exclusively, to reducing dielectric breakdown in high-voltage MOS transistors.

BACKGROUND

High voltage devices, such as MOS power transistors, may need to drop a relatively high voltage, e.g. tens or even hundreds of volts, between device terminals. Insulators in the device may fail in some circumstances, possibly leading to device failure, and inoperability of a system in which the device is used.

SUMMARY

The inventors disclose various methods and devices that may reduce the probability of dielectric breakdown at or near a neck, or bird's-beak of a dielectric layer in a MOS transistor. While such embodiments may have, on average, greater reliability in field applications, no particular result is a requirement of the present invention unless explicitly recited in a particular claim.

In one example an integrated circuit includes a source region and a drain region that are spaced apart and extend into a semiconductor layer having a first conductivity type, the source region and the drain region having an opposite second conductivity type. A gate electrode extends between the source and the drain regions. A dielectric layer is located between the gate electrode and the semiconductor layer. The dielectric layer has a first portion having a first thickness in contact with the semiconductor layer, and a second portion with a greater second thickness over the semiconductor layer. The second portion includes a lateral perimeter that surrounds the source region and includes first and second linear sections. The first linear section extends over the semiconductor layer between the source region and the drain region along a first direction. The second linear section extends over the semiconductor layer along a different second direction. A fillet in the dielectric layer having the second thickness is located at an intersection of the first and second linear sections.

Another example provides an integrated circuit that includes a source region between first and second drain regions. The source region and the drain regions extend into a semiconductor layer and have a first conductivity type, and the semiconductor layer has an opposite second conductivity type. A gate electrode extends between the source and the drain regions. A dielectric layer is located between the gate electrode and the semiconductor layer. The dielectric layer includes a first portion having a first thickness in contact with the semiconductor layer, and a second portion with a greater second thickness over the semiconductor layer. The second portion has a lateral perimeter that includes a first linear section extending on the top surface of the semiconductor layer along a first direction and a second linear section extending on the top surface of the semiconductor layer along a different second direction. A third section joins the first and second sections and has a lateral radius of curvature of at least 0.25 μm.

Other examples include methods of forming semiconductor devices according to the semiconductor devices described above.

DETAILED DESCRIPTION

The present disclosure is described with reference to the attached figures. The figures are not necessarily drawn to scale, and they are provided without implied limitation to illustrate various described examples. Several aspects of the disclosure are described below with reference to example applications for illustration. It should be understood that numerous specific details, relationships, and methods are set forth to provide an understanding of the disclosure. The present disclosure is not limited by the illustrated ordering of acts or events unless stated otherwise, as some acts may occur in different orders and/or concurrently with other acts or events. Furthermore, all illustrated acts or events may not be required to implement a methodology in accordance with the present disclosure.

Various disclosed methods and devices of the present disclosure may be beneficially applied to high voltage transistors used in switching DC-DC converters and other applications. While such examples may be expected to increase reliability and/or reduce transistor failures, no particular result is a requirement of the present invention unless explicitly recited in a particular claim.

Figure 1A:
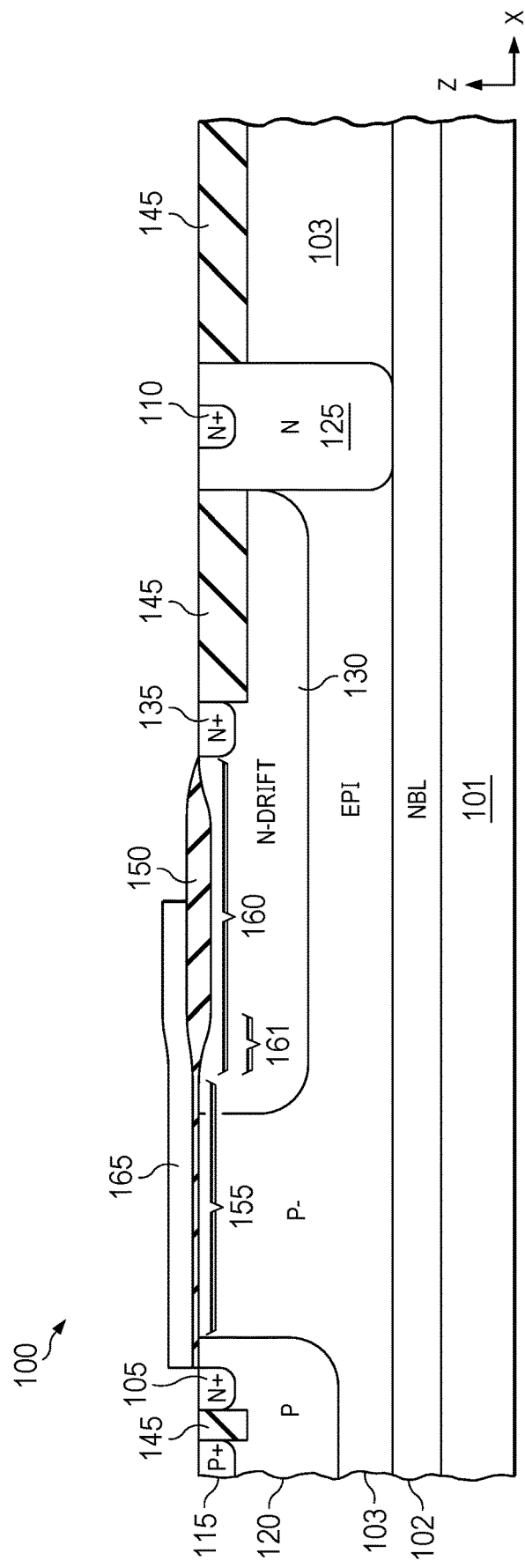
FIG. 1A illustrates in section view an example transistor of the disclosure.

FIG. 1A shows a section view of a device 100, e.g. a field-effect transistor (FET). The device 100 may be a portion of an integrated circuit in which the device 100 is formed on or over a substrate 101. The substrate 101 is not limited to any particular type or material, but is referred to for convenience in some examples as a silicon substrate or a silicon wafer, which may be P-type, that includes a silicon layer over which several electronic devices are formed. A lightly doped P-type (P⁻) epitaxial layer 103 is located over the substrate 101, and an N-type buried layer (NBL) 102 is located between the substrate 101 and the epitaxial layer 103. The NBL 102 and epitaxial layer 103 may be formed by any suitable existing or future-developed processes.

The device 100 includes a source 105 and drain 110. For convenience, examples are described for which the source and drain are N-type and the body region is P-type, recognizing that in some other examples these designations may be reversed, with suitable changes to other doped regions. The source 105 and a body contact 115 are located in a P-type well (PWELL) 120, and the drain 110 is located in a deep N-type well (DEEPN) 125 that extends to the NBL 102. An N-type drift region (N-drift) 130 extends between the source 105 and the drain 110. The epitaxial layer 103 has a top surface between the PWELL 120 and the N-drift region 130. An N-type region 135 is located within the drift region 130. Shallow trench isolation (STI) structures 145 laterally isolate the source 105 and the body contact 115, and the DEEPN 125 and the N-type region 135.

A dielectric layer 150 extends from the source 105 to the N-type region 135. The dielectric layer 150 includes a thin portion 155, sometimes referred to as a gate dielectric portion 155, that touches the epitaxial layer 103 between the PWELL 120 and the drift region 130. The dielectric layer 150 also includes a thick portion 160, sometimes referred to as the field-relief portion 160, that touches the drift region 130 between the gate dielectric portion 155 and the N-type region 135. The gate dielectric portion 155 may be formed by thermal oxidation of the epitaxial layer 103, and the field-relief portion 160 may be formed by a local oxidation of silicon (LOCOS) process, and as such may include "bird's beak" portions at ends of the field-relief portion 160, including a bird's beak 161.

A gate electrode 165 extends between the source 105 and the drain 110. In the illustrated example the gate electrode 165 covers the gate dielectric portion 155 and the bird's beak 161, and partially covers the field-relief portion 160. A remaining section of the field-relief portion 160 is not covered by the gate electrode 165.

Figure 1B:
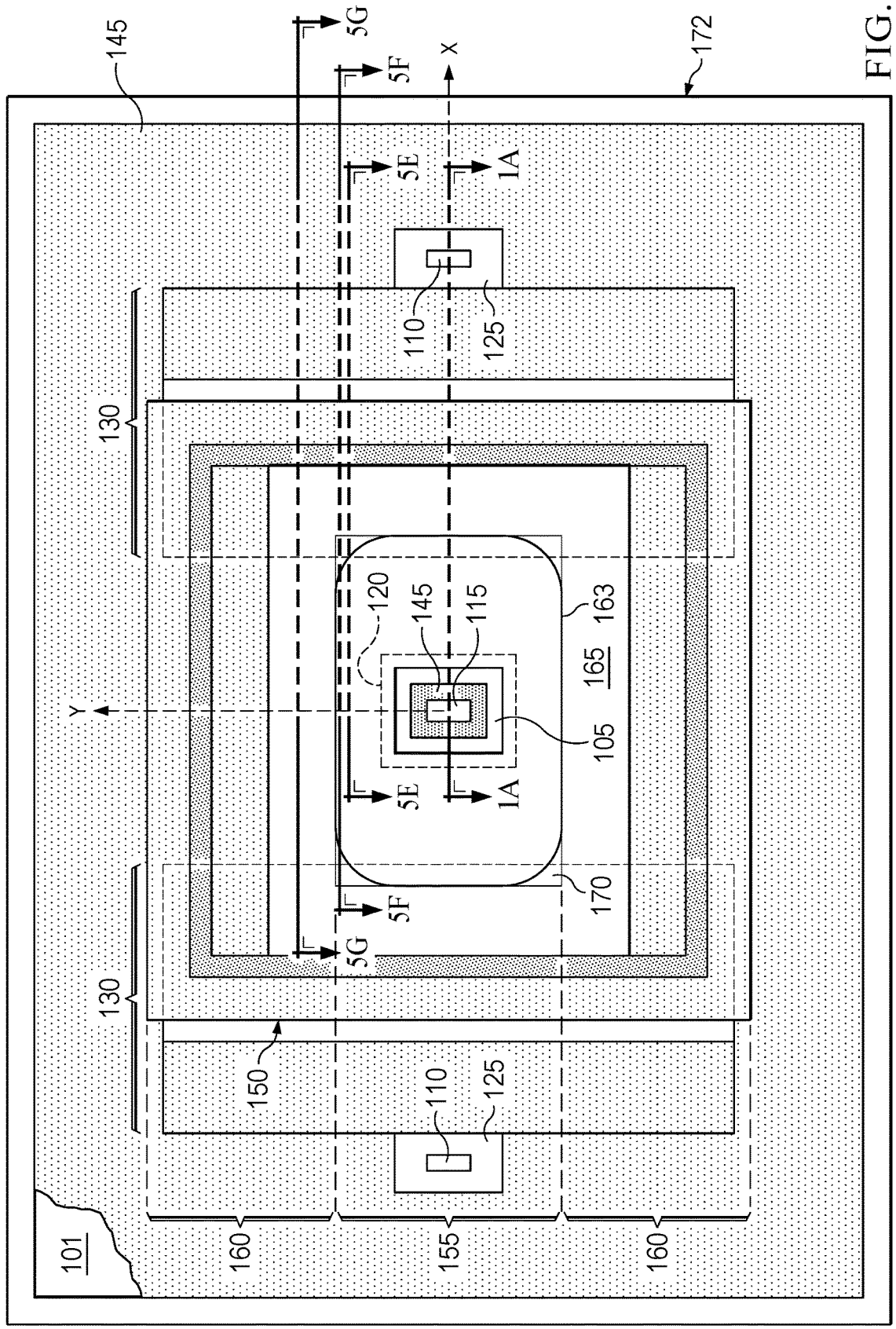
FIG. 1B illustrates in the example transistor of FIG. 1A in plan view.

FIG. 1B shows the device 100 in a plan view in which some of the features shown in FIG. 1A are omitted for clarity. Not shown in FIG. 1A is a deep-trench isolation structure 172 that may encircle the device 100. The device 100 is symmetric with respect to the y-axis of the illustrated coordinate references. As shown, the FIG. 1A section is through one half of the device 100, and thus some features of FIG. 1A are duplicated in the other half of the device 100 in FIG. 1B, and may be referred to in plural form. A lateral perimeter 163 marks the boundary between the gate dielectric portion 155 and a field-relief portion 160 of the gate electrode 150. The drift regions 130 extend vertically (along the y-axis, above and below the x-axis) past the gate electrode 165, and the dielectric layer 150 extends vertically to a similar extent. Furthermore the dielectric layer 150 and the drift regions 130 extend vertically past the vertical extent of the drains 110, shown as $\pm Y_D$ (see FIG. 3A). In the illustrated example the drift regions 130 are about six times wider than the drains 110. The source 105 may, as illustrated, have a same or similar vertical extent as the drains 110.

During operation, the gate electrode 165 is biased with respect to the epitaxial layer 103 (channel region) in a manner that allows current to flow between the source 105 and the drains 110. The bias results in an electric field between the gate electrode 165 and the epitaxial layer 103. The current flows generally along the x-axis between the source 105 and the drains 110. Above and below $\pm Y_D$, the current may spread such that a component of the current flow is along the y-axis. This current spread may enhance the electric field experienced by the dielectric layer 150 under the gate electrode 165, for example at or near the bird's beak 161. This enhanced electric field may result in dielectric breakdown of the dielectric layer 150 and failure of the device in some circumstances.

Figure 2A:
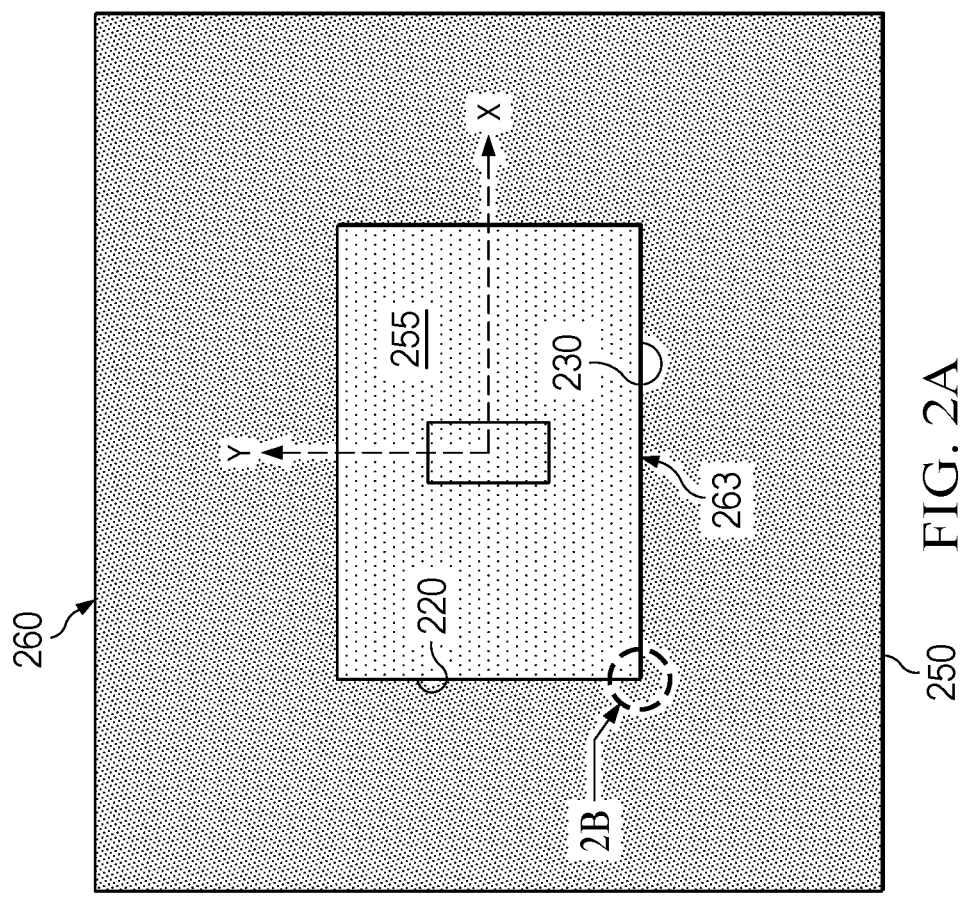
FIGS. 2A and 2B illustrate aspects of a LOCOS layer of a baseline transistor.
Figure 2B:
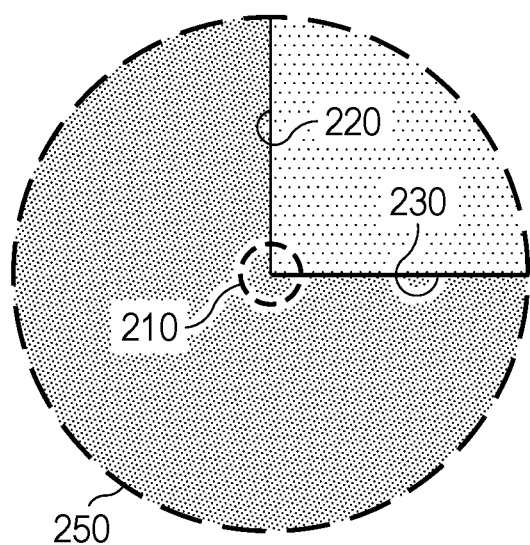

Referring to FIGS. 2A and 2B, one possible baseline configuration of a dielectric layer 250 is illustrated. The example baseline dielectric layer 250 includes a thin portion 255 and a thick portion 260, with a perimeter 263 marking the boundary between these portions, e.g. a bird's beak transition from the thick portion 260 to the thin portion 255. The perimeter has corners exemplified by a corner 210 (FIG. 2B). The corner 210 is formed by the intersection of a first (vertical) edge 220 and a second (horizontal) edge 230. The first edge 220 and the second edge 230 are essentially linear up to the corner 210. The corner 210 has a radius of curvature that may be determined by, e.g., the limits of the resolution of a photoresist layer used to delimit the extent of the thick portion 260 and the wavelength of the light used to expose the photoresist layer. Without implied limitation, the radius of curvature of the corner 210 may be 100 nm or less. Such a corner may be referred to as a "sharp corner". Thus the first edge 220 is essentially oriented along the y-axis over the entire vertical extent of the thin portion 255 and the second edge 230 is essentially oriented along the x-axis over the entire horizontal extent of the thin portion 255.

Referring again to FIG. 1B, the inventors have discovered that when the corners of the dielectric layer 150 include fillets 170, e.g. a rounding or filling of what would otherwise be a sharp corner, the instances of the dielectric breakdown described earlier may be substantially reduced or eliminated. Without limitation by theory, it is thought that the benefit of the fillets results from moving the bird's beak 161 toward the center of the device 100, e.g. away from the area with enhanced electric field, thus maintaining the field-relief portion 160 of the dielectric layer 150 in the portion of the device in which the enhanced electric fields are strong enough to result in dielectric breakdown of the thinner dielectric in gate dielectric portion 155 near the bird's beak 161.

Figure 3A:
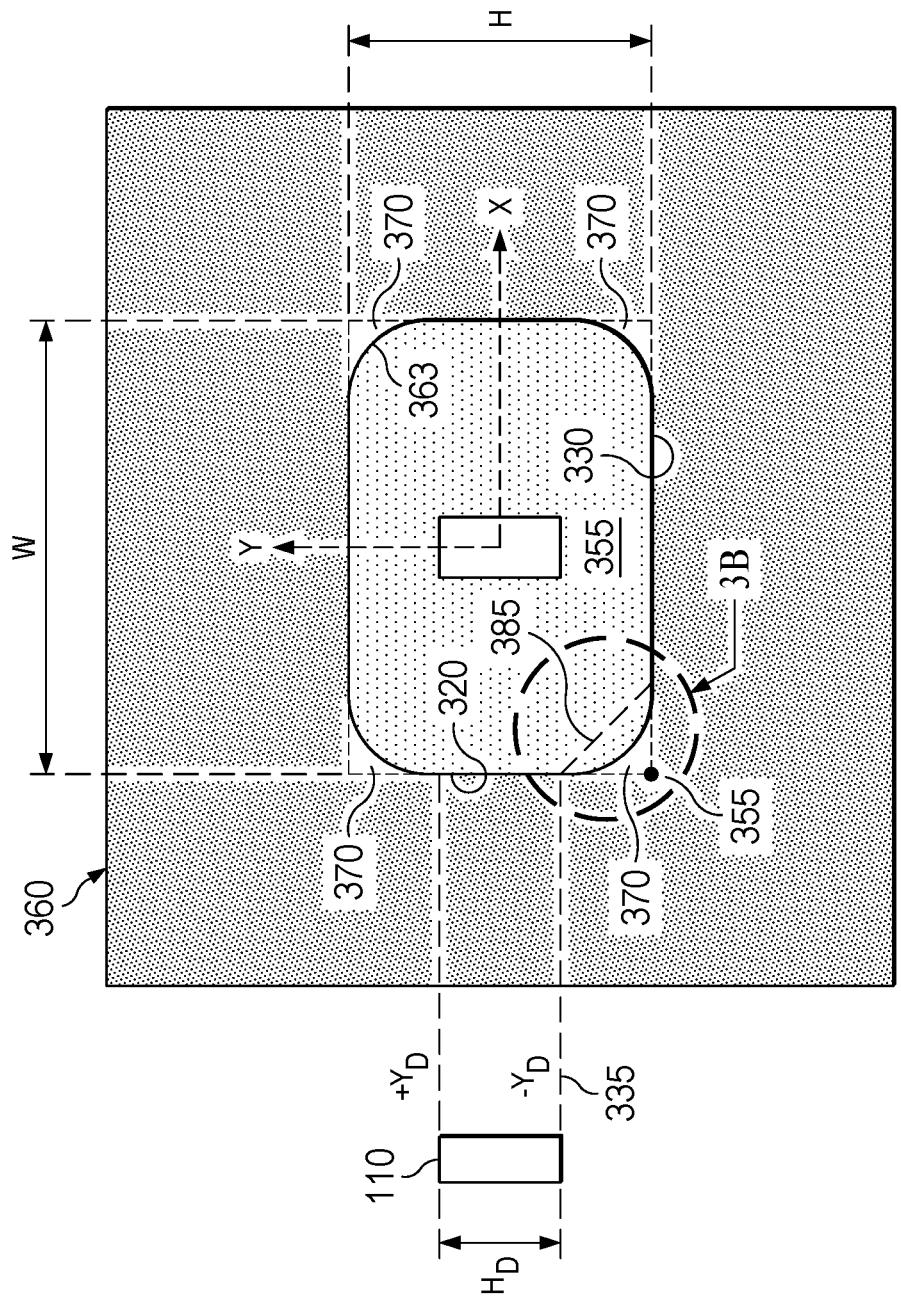
FIGS. 3A and 3B illustrate aspects of a LOCOS layer according to various examples of the disclosure.
Figure 3B:
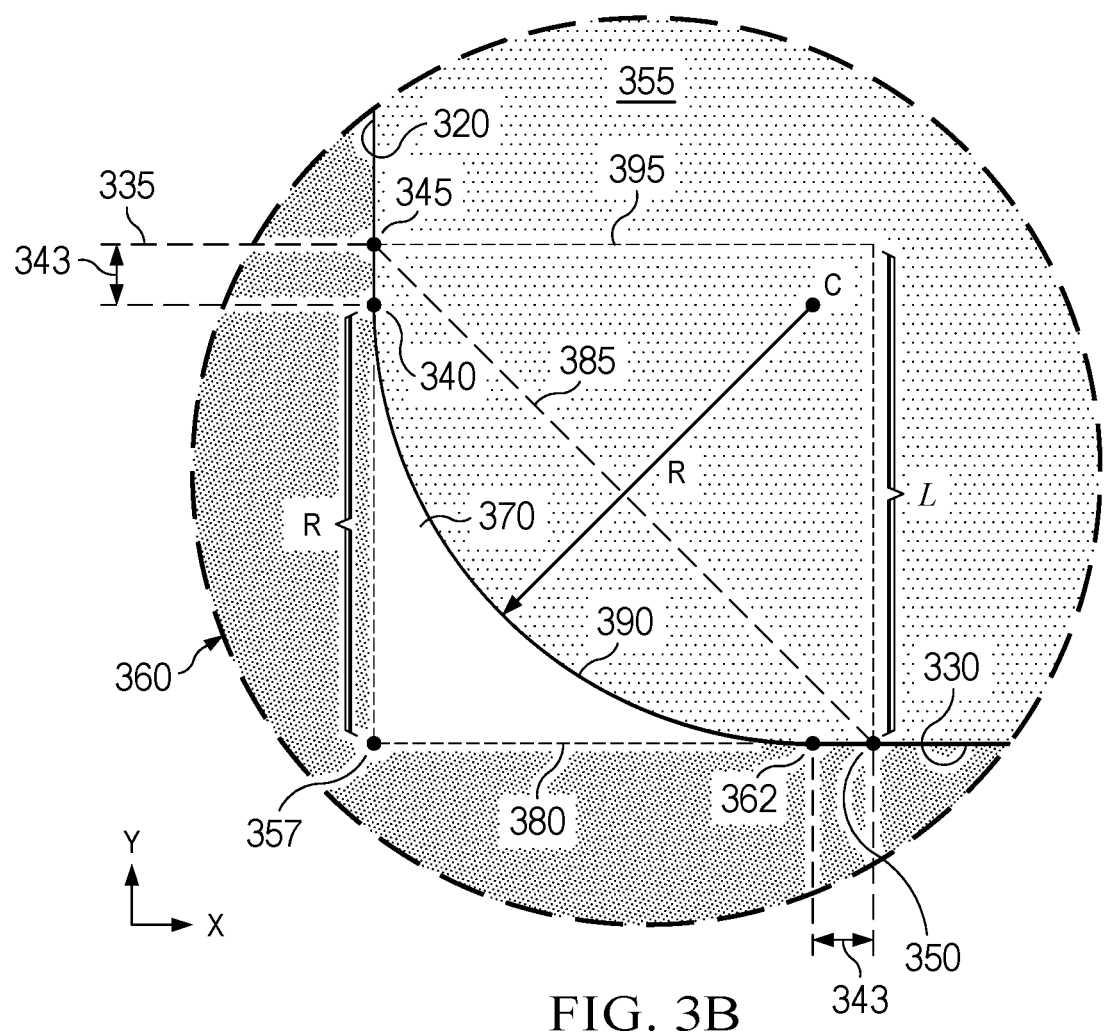

FIGS. 3A and 3B, described concurrently, illustrate four instances of a fillet 370 at corners between a LOCOS layer 360 and a gate oxide layer 355 according to one example. A local rectilinear coordinate system is defined by the x-axis and a y-axis. A perimeter 363 denotes a boundary between the LOCOS layer 360 and the gate oxide layer 355. A bird's beak may be coincident with the perimeter 363. The perimeter 363 includes a first edge 320 parallel to the y-axis and a second edge 330 parallel to the x-axis. The first and second edges 320, 330 may be respectively referred to without implied limitation as the vertical edge 320 and the horizontal edge 330. The vertical edge 320 has a linear segment that ends at a point 340 and the horizontal edge 330 has a linear segment that ends at a point 362. The fillet 170 has an edge 390 that includes at least one segment that extends in a direction other than parallel to the axes of the rectilinear coordinates. The point 340 is the point at which the fillet edge 390 intersects the vertical edge 320, and the point 362 is the point at which the fillet edge 390 intersects the horizontal edge 330. In the current example the edge 390 describes an arc that is a segment of a circle having a center C and a radius of curvature R. As used herein, "radius of curvature" excludes an infinite radius of curvature, e.g. a straight line. The linear segment of the vertical edge 320 and the linear segment of the horizontal edge 330 project to a point 357 that may be referred to as the "projected corner" 357.

A reference line 335 indicates the maximum extent $-Y_D$ of the drain 110 in the minus y-direction and intersects the vertical edge 320 at a point 345. The reference line 335 is spaced apart from the horizontal edge 330 by a length $\mathcal{L}$. A point 350 is also spaced apart from the projected corner 357 by $\mathcal{L}$. A "corner area" 385 having an area A is defined by points 345, 350, 357, e.g. an isosceles right triangle having two sides of length $\mathcal{L}$. Thus the corner area 395 has an area $\mathcal{L}^2/2$. The fillet 170 has a "fill area" bounded by a first side between the point 340 and the projected corner 357, a second side between the point 362 and the projected corner 357, and the fillet edge 390. The fraction of the corner area occupied by the fillet 370 is sometimes referred to as a "fill ratio", which may be 100% when the fillet 370 exactly fills the fill area. In examples in which the edge 390 is a circular arc and the point 340 coincides with the reference line 335 ($\mathcal{L}$=R), the fillet 170 has a fill ratio of about 43%. Other examples may include a fillet bounded by other than a circular arc, or a fillet that does not extend fully to the reference line 335 in the Y-direction, or to the distance $\mathcal{L}$ from the projected corner 357, which may result in a fill ratio greater than or lesser than 43%.

In one example for which the edge 390 is a circular arc having radius of curvature R=$\mathcal{L}$/2, the fill ratio is about 11%, and in another example for which the edge 390 is a circular arc having radius of curvature R=$\mathcal{L}$/4, the fill ratio is about 5%. A feature that has a fill ratio less than 5%, and/or that has an edge described by a circular arc having a radius of curvature less than 100 nm, is expressly excluded from the scope of the term "fillet" as the term us used herein. Thus, for example, the term fillet excludes a corner that includes rounding due to sub-wavelength resolution of a photolithography process.

Figure 4A:
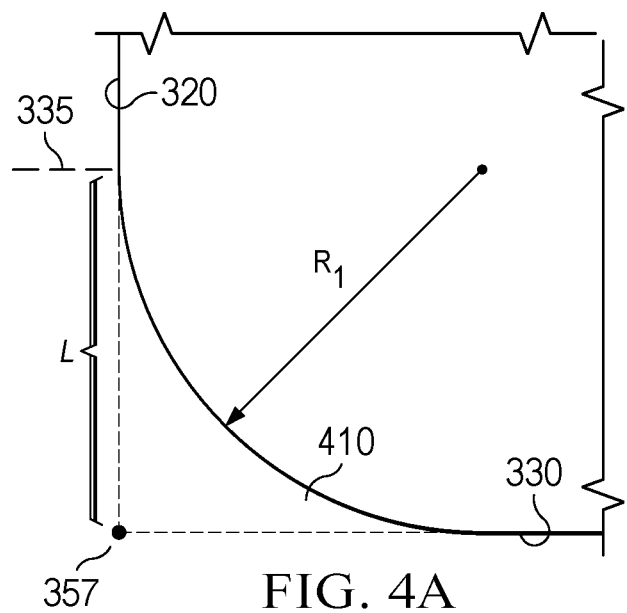
FIGS. 4A through 4J illustrate various examples of a corner fillets of a LOCOS layer.
Figure 4B:
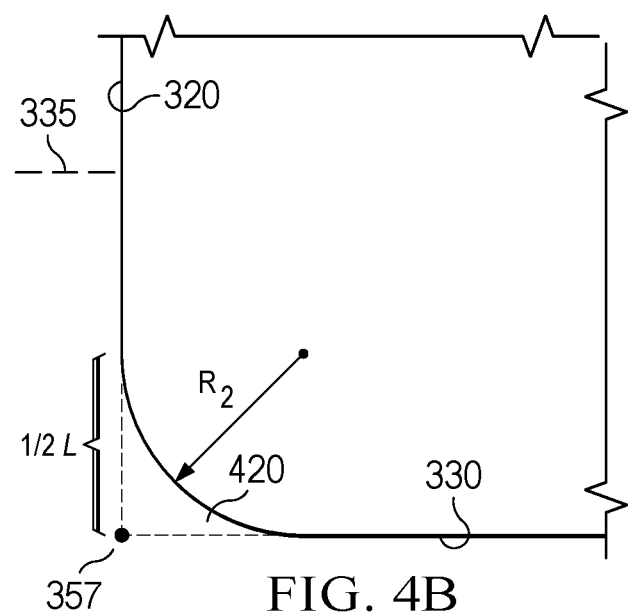
Figure 4C:
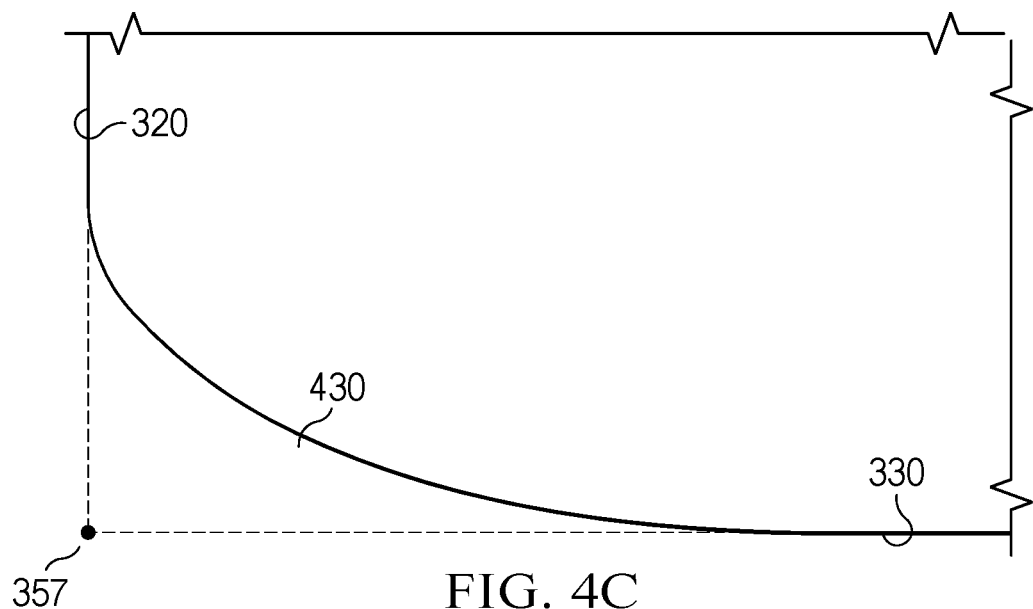

FIGS. 4A-4J illustrate fillets 410-495 that exemplify various geometries the fillet may take. FIGS. 4A-4C represent examples in which a curvilinear segment, or circular arc, extends from the vertical edge 320 to the horizontal edge 330 of the dielectric layer 150. In some examples the curvilinear segment has a profile that may be approximated by piecewise-linear segments, for example when a layout tool is unable to produce a true curvilinear segment. FIGS. 4A and 4B are examples of "symmetric" fillets, respectively fillet 410 and fillet 420. The fillets 410 and 420 are symmetric in the sense that each of these fillets intersects the vertical edge 320 and the horizontal edge 330 at a same distance from the projected corner 357. The fillets 410 and 420 also have a constant radius of curvature. In FIG. 4A the fillet 410 intersects the vertical edge 320 at a point corresponding to the reference line 335 projected onto the edge of the dielectric layer 150. (See FIGS. 3A/3B.) The fillet 410 intersects the horizontal edge 330 at a point corresponding to the same distance from the projected corner 357. The radius of curvature $R_1$ of the circular arc of the fillet 410 is the distance from the projected corner 357 to the reference line 335. In this example the fill ratio of the fillet 410 is about 43%. In the example of FIG. 4B, the fillet 420 has a radius of curvature $R_2$=½ $R_1$, and a fill ratio of about 11%. The circular arc that describes the edge of the fillet 420 intersects the vertical edge 320 and the horizontal edge 330 at points spaced apart from the projected corner 357 by ½ the distance from the projected corner 357 to the reference line 335. While the radius of curvature of a fillet such as exemplified by FIGS. 4A and 4B may be any value that otherwise conforms with the disclosure, a radius of curvature of at least about 0.5 μm and at most about 1 μm has been determined to provide acceptable results. FIG. 4C exemplifies an "asymmetric" fillet 430 without referring to the reference line 335 (thus arbitrarily sized). The fillet 430 is asymmetric in that the fillet 430 intersects the vertical edge 320 and the horizontal edge 330 at different distances from the projected corner 357. Because of this asymmetry, the edge of the fillet 430 is described by a transition curve, e.g. a curve having a non-constant radius of curvature.

Figure 4D:
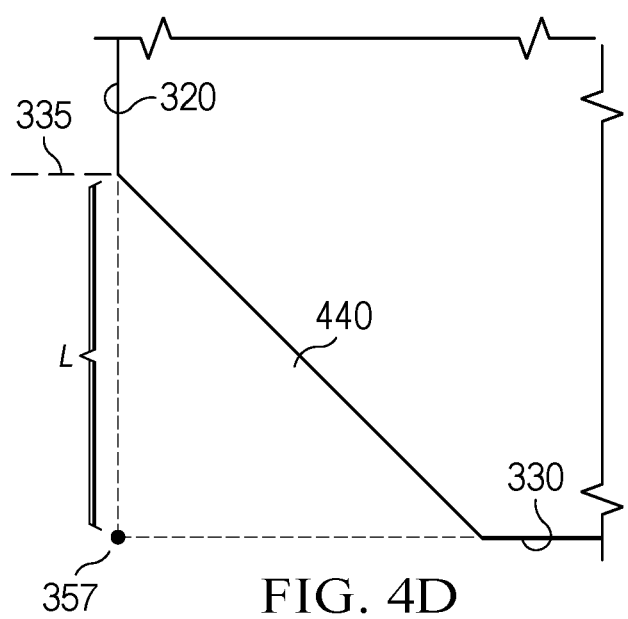
Figure 4E:
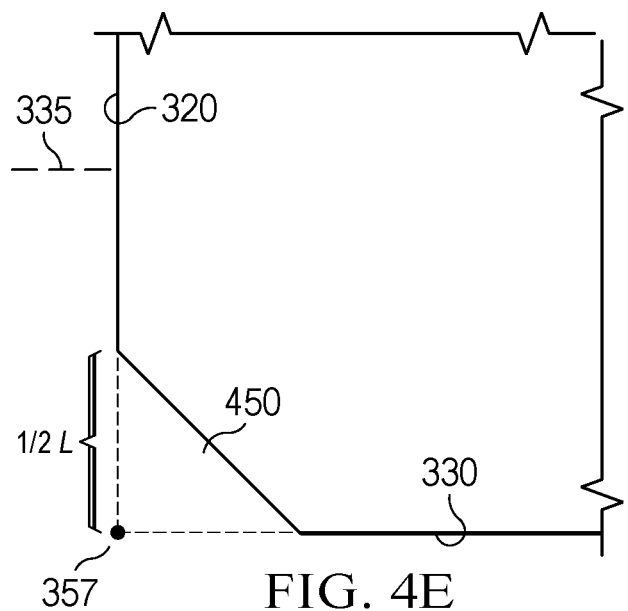
Figure 4F:
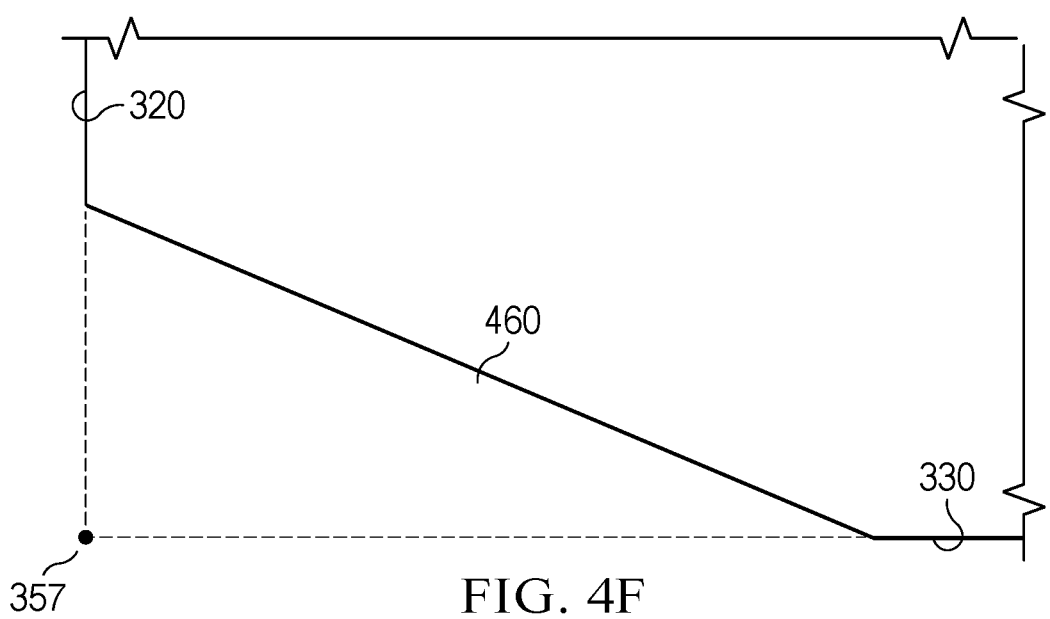
Figure 4G:
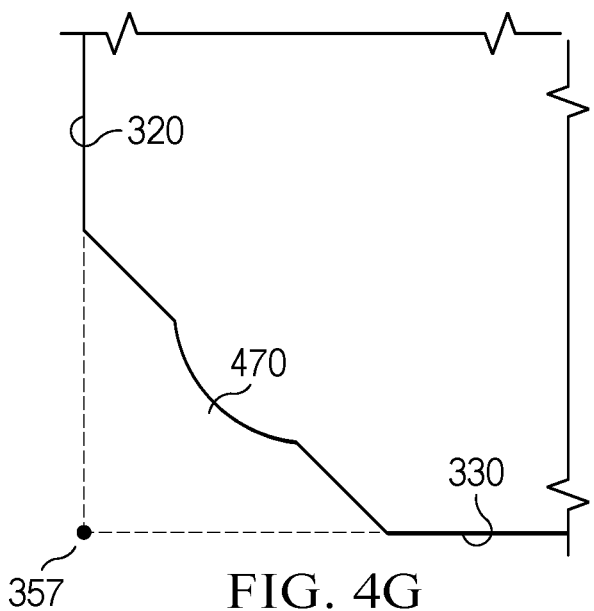
Figure 4H:
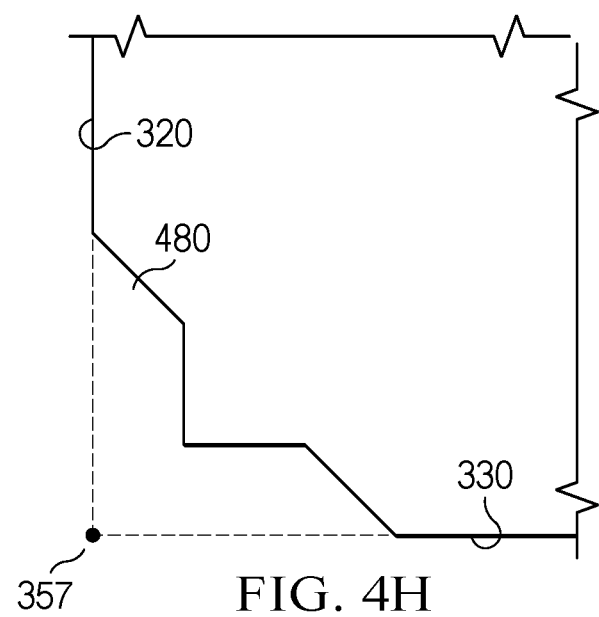
Figure 4I:
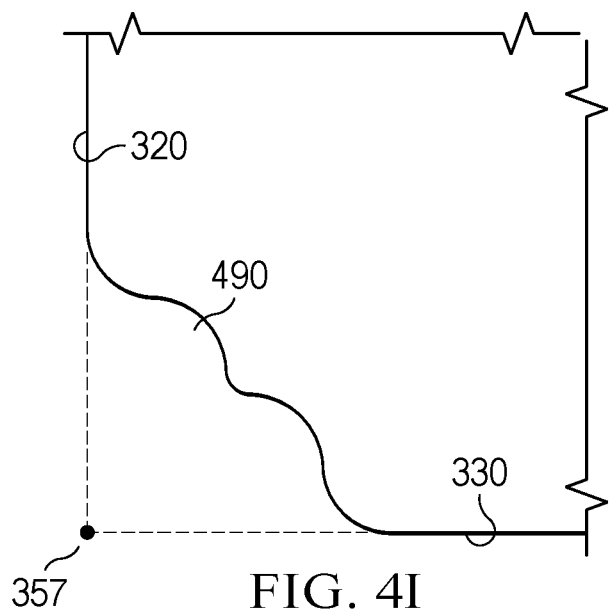
Figure 4J:
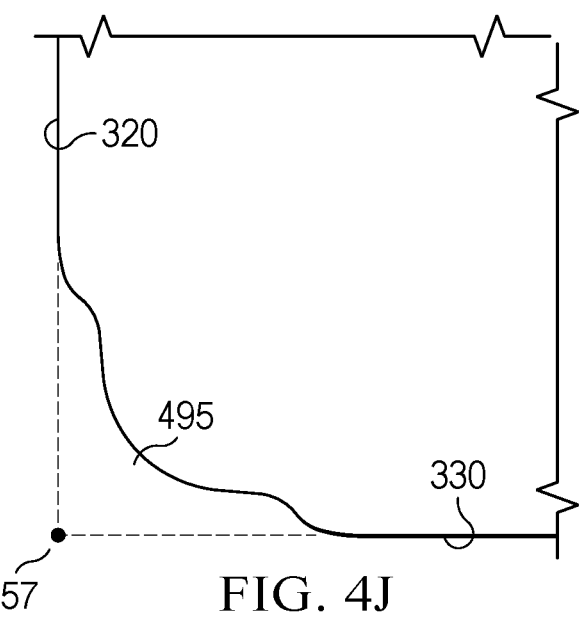

FIGS. 4D-4F represent examples in which respective fillets 440, 450, 460 each have a straight linear edge that extends from the vertical edge 320 to the horizontal edge 330. Such fillets may be referred to as "triangular" fillets. Analogous to FIGS. 4A and 4B, the fillet 440 of FIG. 4D intersects the vertical edge 320 and the horizontal edge 330 at points spaced apart from the projected corner by the length $\mathcal{L}$, and the fillet 450 of FIG. 4E intersects the vertical edge 320 and the horizontal edge 330 at points spaced apart from the projected corner by the length $\mathcal{L}$/2, in two non-limiting examples. The fillets 430 and 440 both have a linear edge, with the fill ratio of the fillet 440 being 100% and the fill ratio of the fillet 450 being 25%. In the example of FIG. 4F, the fillet 460 is asymmetrical.

FIGS. 4G-4J illustrate examples of more complex geometries that may define fillets 470, 480, 490 and 495. While these examples are non-limiting, they illustrate the principle that the fillet may have an edge defined by a combination of one or more linear segments and one or more curved segments.

Figure 5A:
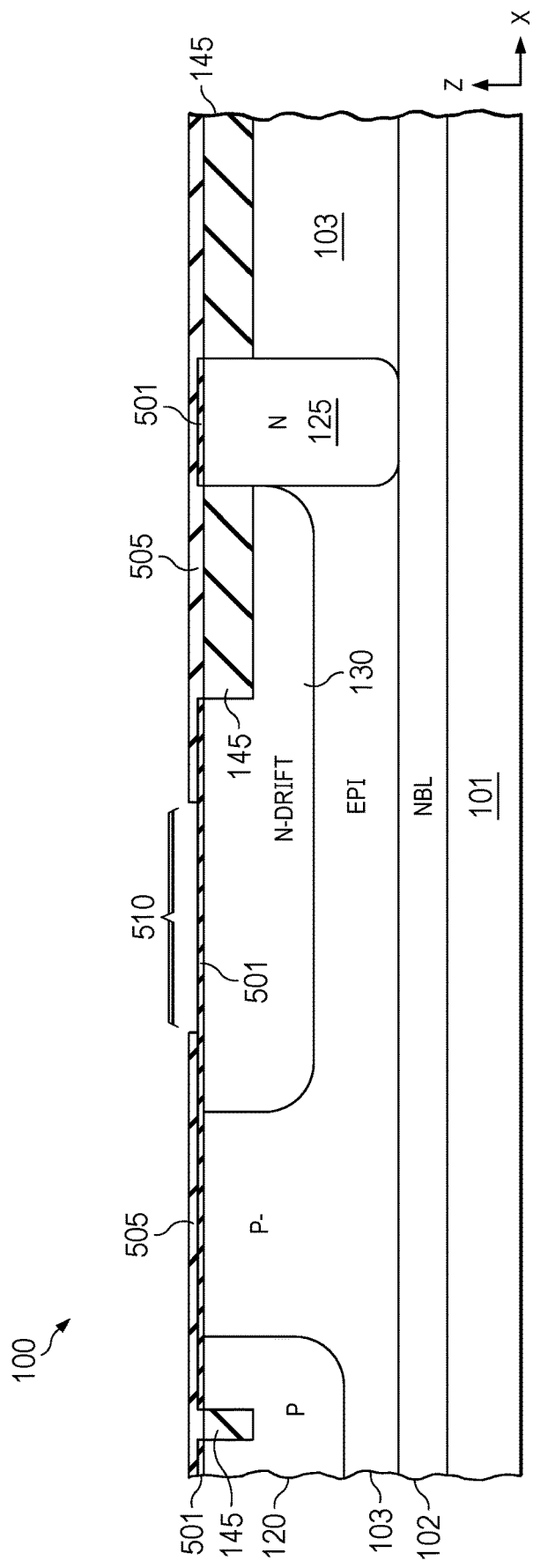
FIGS. 5A-5G illustrate in sectional view an example transistor at various stages of manufacturing.

Turning to FIGS. 5A-5G, sectional figures are shown of the device 100 at various stages of formation, in which like numbers refer to like features of FIG. 1A. FIGS. 5A-5D are shown at the same cut lines as for FIG. 1A, marked in FIG. 1B. In FIG. 5A, various processes have been performed to form the P-type epitaxial layer 103 over the substrate 101, with the NBL 102 therebetween. The STI structures 145 have been formed, as have the PWELL 120, the DEEPN 125 and the N-drift 130. An oxide layer 501 has been formed, and a silicon nitride layer 505 has been formed over the oxide layer 501. While not limited to any particular thickness, in some examples the oxide layer 501 has a thickness in a range from 10 nm to 20 nm. An opening 510 has been formed within the silicon nitride layer 505 at a location at which of the field-relief portion 160 of the dielectric layer 150 is to be formed.

Figure 5B:
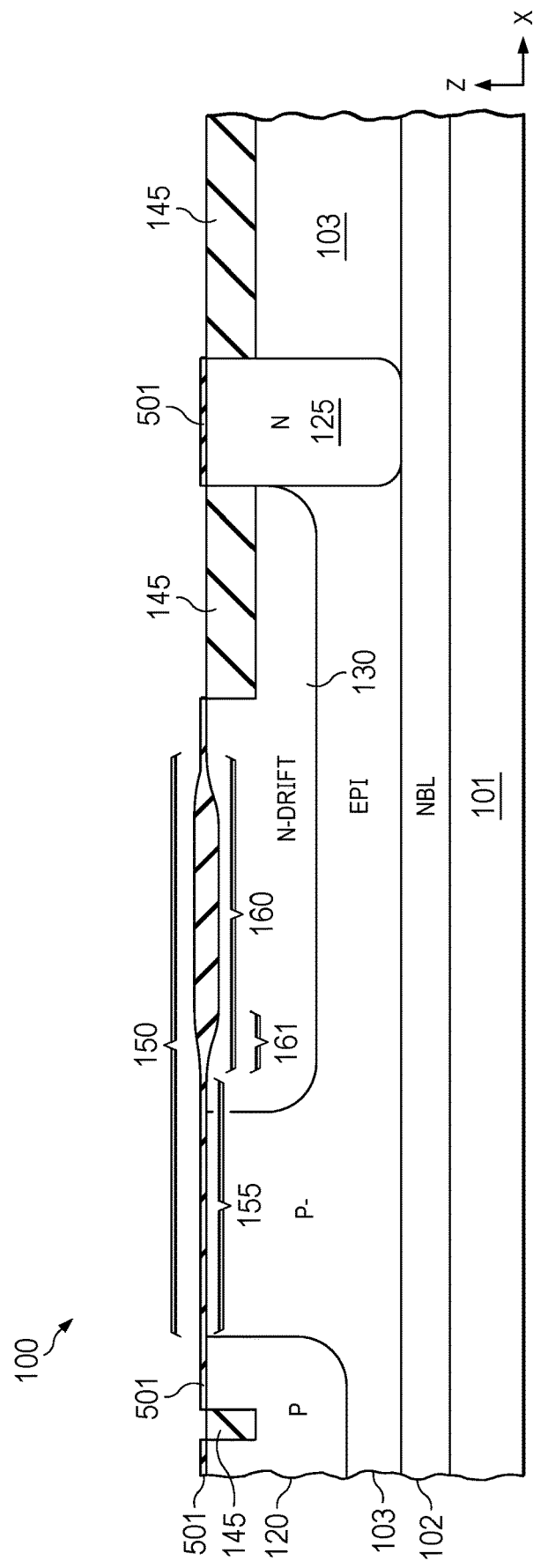

FIG. 5B shows the device 100 after formation of the field-relief portion 160 of the dielectric layer 150 by thermally oxidizing the semiconductor material within the opening 510, sometimes referred to as a LOCOS process. The silicon nitride layer 505 has been removed at this stage of processing. The dielectric layer 150 includes the gate dielectric portion 155 and the field-relief portion 160. The gate dielectric portion 155 will act as the gate dielectric layer of the device 100 and the field-relief portion 160 will act as a field relief oxide. While not limited to any particular thickness, in some examples the field-relief portion 160 has a thickness in a range from 20 nm to 400 nm. The field-relief portion 160 includes the bird's beak 161 at the transition to the gate dielectric portion 155. The gate dielectric portion 155 extends over the N-drift region 130 such that the bird's beak 515 is entirely over the N-drift region 130 in this view.

Figure 5C:
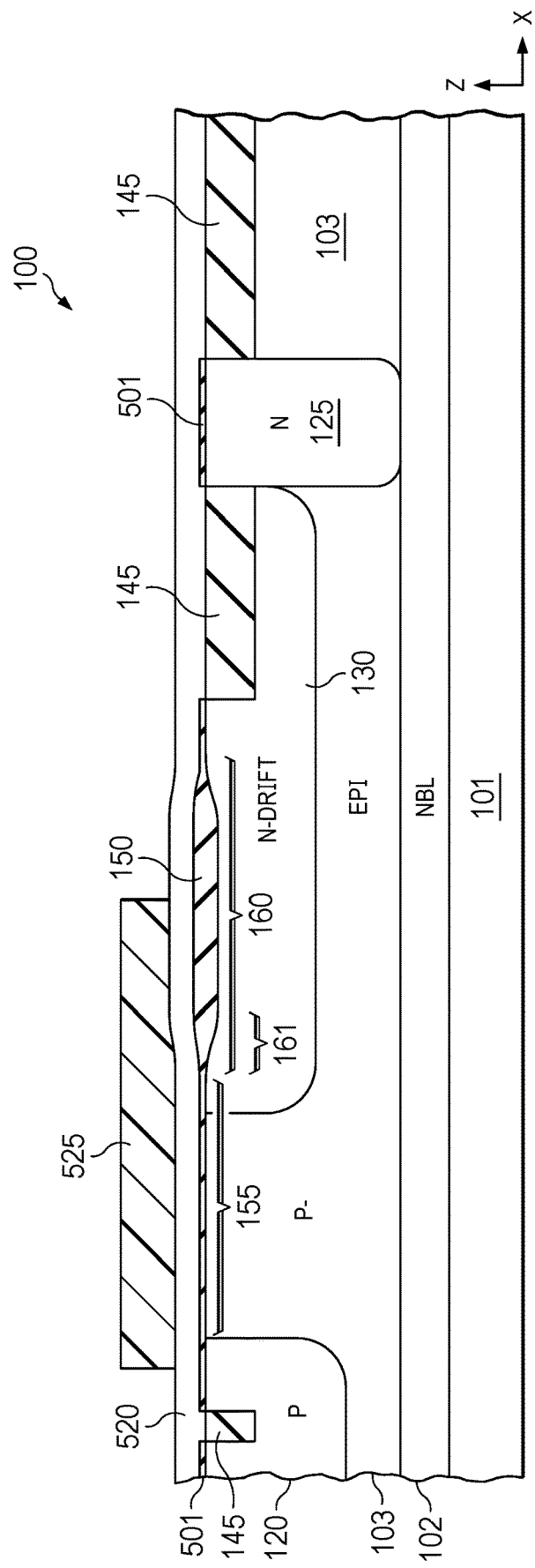

In FIG. 5C a polysilicon layer 520 has been formed over the dielectric layer 150, and a resist layer 525 has been patterned to delineate the dielectric layer 150 and the gate electrode 165.

Figure 5D:
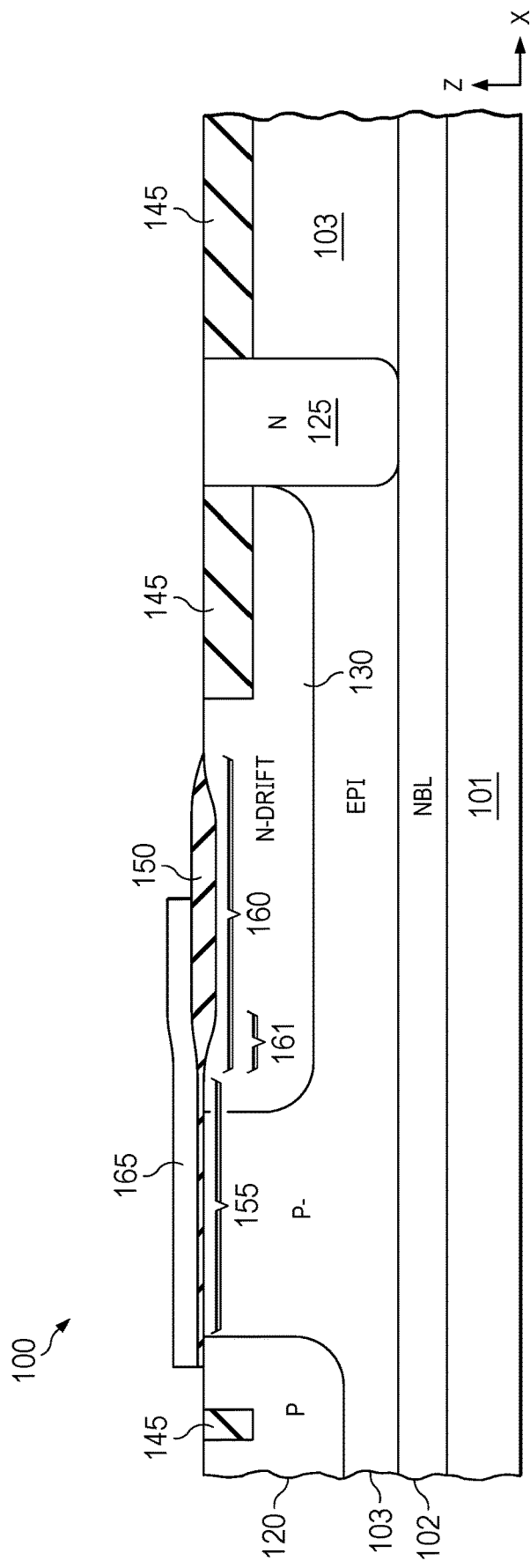

FIG. 5D shows the device 100 after removing exposed portions of the polysilicon layer 520, thereby producing the gate dielectric portion 155, the field-relief portion 160, and the gate electrode 165.

Referring back to FIG. 1B, this view shows the device 100 after formation of various implanted regions, including the source 105, drain 110, body contact 115 and N-type region 135. Other devices, not explicitly shown, may be formed over and/or extending into epitaxial layer 103, such as resistors, capacitors, inductors, MOS transistors and/or bipolar transistors. Such devices may be integrated with the device 100 using metal interconnects of any known or future-developed type. The device 100, and any such integrated devices, may by packaged in a board-mountable package of any type.

Figure 5E:
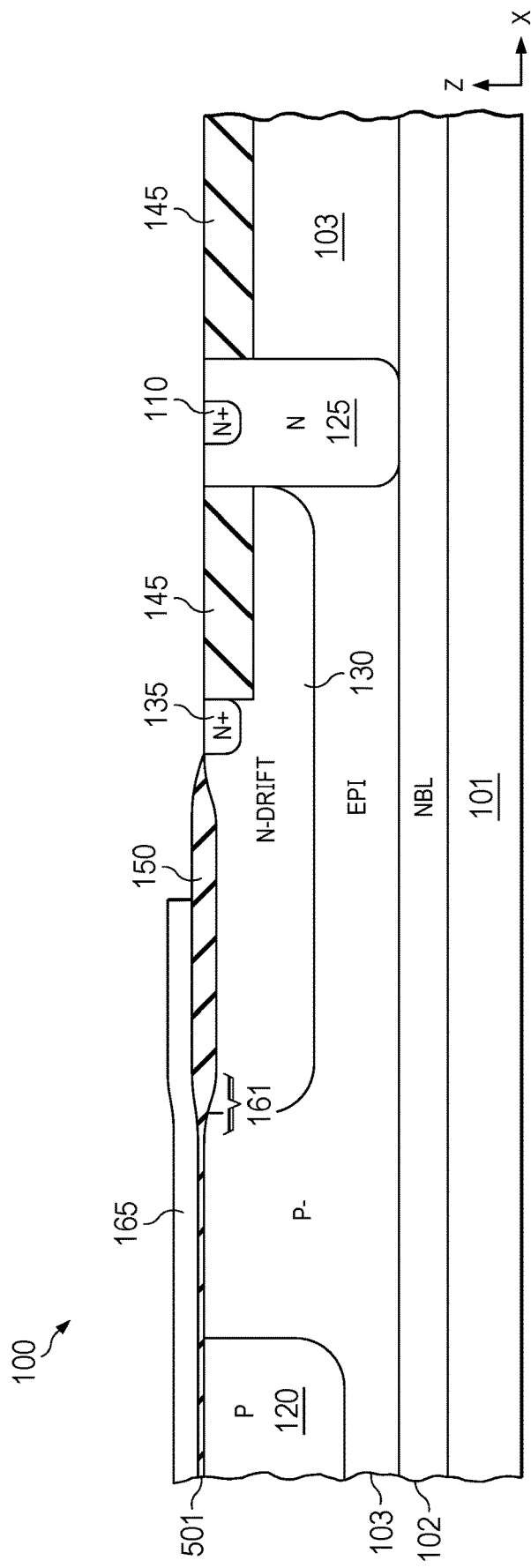

FIG. 5E shows the device 100 at the same stage of manufacturing as FIG. 1B at the view marked in FIG. 1A. Because of the presence of the fillet 170, the bird's beak 515 is located closer to the edge of the N-drift region 130, or may overlap the edge as illustrated. Also, this view is outside the source opening through the gate electrode 165, so the gate electrode 165 extends uninterrupted to the left-hand side of the figure. It is thought that the observed improvement of device reliability results from the shifting of the bird's beak 515 toward the PWELL 120, thereby thickening the dielectric over the interface between the epitaxial layer 103 and the N-drift region 130 and reducing the chance of dielectric breakdown that may otherwise occur due to the enhanced electric field in this portion of the device 100.

Figure 5F:
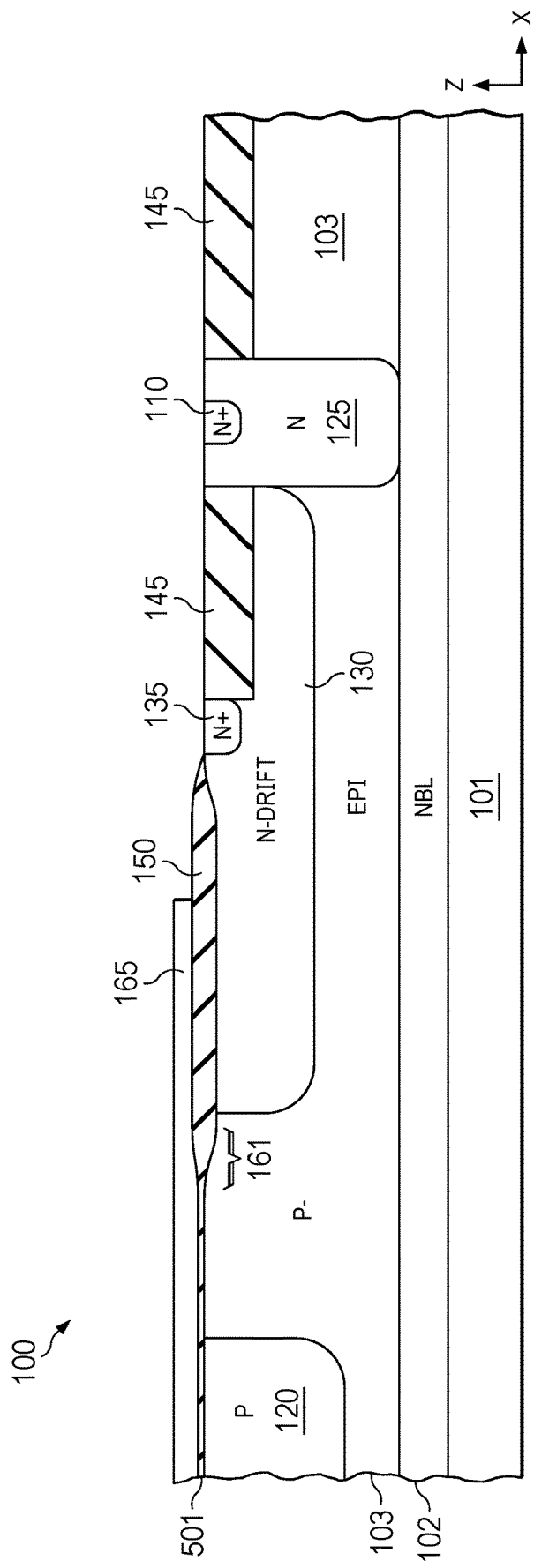

FIG. 5F shows the device 100 at the same stage of manufacturing as FIGS. 1A and 5E at the view marked in FIG. 1A. Because of the presence of the fillet 170, the bird's beak 515 is located to the left of the N-drift region 130, directly touching the epitaxial layer 103.

Figure 5G:
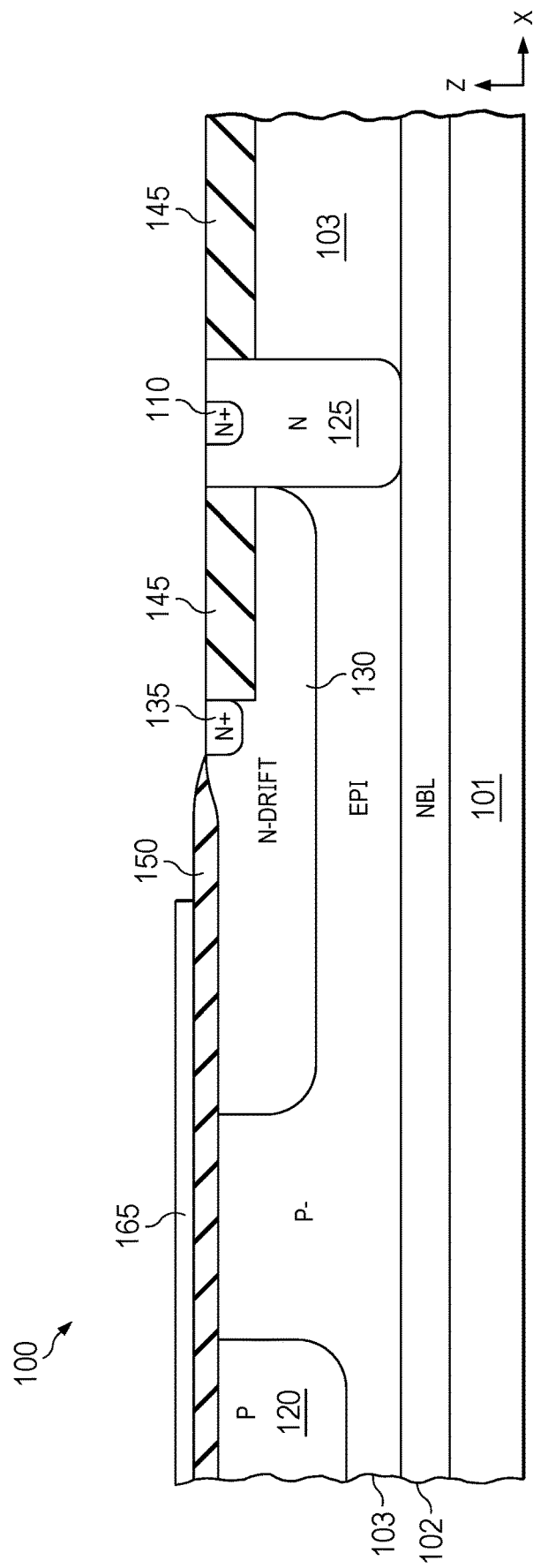

FIG. 5G shows the device 100 at the same stage of manufacturing as FIGS. 1A, 5E and 5F at the view marked in FIG. 1A. This view is completely within the field-relief portion 160 of the dielectric layer 150. Thus the field-relief portion 160 extends without interruption the left-hand limit of the figure.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An integrated circuit, comprising:
    a source region and a drain region spaced apart and extending into a semiconductor layer having a first conductivity type, the source region and the drain region having an opposite second conductivity type;
    a gate electrode extending between the source and the drain regions; and
    a dielectric layer between the gate electrode and the semiconductor layer, the dielectric layer including a first portion having a first thickness in contact with the semiconductor layer, and a second portion with a greater second thickness over the semiconductor layer, a lateral perimeter of the second portion surrounding the source region and including:
        a first edge having a first linear segment extending over the semiconductor layer and between the source region and the drain region along a first direction; and
        a second edge having a second linear segment extending over the semiconductor layer along a different second direction; and
        a fillet of the second portion connecting the first linear segment and the second linear segment of the lateral perimeter.

2. The integrated circuit of claim 1, wherein the second portion of the dielectric layer touches a well region having the second conductivity type.

3. The integrated circuit of claim 1, wherein the fillet has a constant lateral radius of curvature and begins at a point on the first edge corresponding to a maximum extent of the drain region parallel to the first edge.

4. The integrated circuit of claim 1, wherein an edge of the fillet includes a circular arc having a radius of curvature of at least 0.25 µm.

5. The integrated circuit of claim 1, wherein an edge of the fillet includes a circular arc having a radius of curvature of about 1 µm.

6. The integrated circuit of claim 1, wherein the fillet has a fill ratio of at least 5%.

7. The integrated circuit of claim 1, wherein the fillet has a fill ratio of at least about 20%.

8. An integrated circuit, comprising:
    a source region between first and second drain regions, the source region and the drain regions extending into a semiconductor layer and having a first conductivity type, the semiconductor layer having an opposite second conductivity type;
    a gate electrode extending between the source and the drain regions;
    a dielectric layer between the gate electrode and the semiconductor layer, the dielectric layer including a first portion having a first thickness in contact with the semiconductor layer, and a second portion with a greater second thickness over the semiconductor layer, the second portion having a lateral perimeter that includes a first linear section extending on a top surface of the semiconductor layer along a first direction and a second linear section extending on the top surface of the semiconductor layer along a different second direction, and a third section joining the first and second linear sections, the third section having a lateral radius of curvature of at least 0.25 µm.

9. The integrated circuit of claim 8, wherein the first conductivity type is n-type and the second conductivity type is n-type.

10. The integrated circuit of claim 8, wherein the second portion of the dielectric layer includes a local oxidation of silicon (LOCOS) structure.

11. The integrated circuit of claim 8, wherein the second portion of the dielectric layer has a thickness in a range from about 20 nm to about 40 nm.

12. The integrated circuit of claim 8, wherein the lateral radius of curvature is at least 0.50 µm.

13. The integrated circuit of claim 8, wherein the lateral radius of curvature is about 1 µm.

14. The integrated circuit of claim 8, wherein the source region, the drain region and the gate electrode are components of a metal-oxide-semiconductor (MOS) transistor having a voltage capacity of at least 40 V between the source region and the drain region.

15. The integrated circuit of claim 8, further comprising a drift region having the first conductivity type extending from the drain region toward the source region, the second portion in contact with the drift region.

16. The integrated circuit of claim 8, wherein the third section has an edge with a piecewise-linear profile.

17. The integrated circuit of claim 8, wherein the second portion surrounds the source region and includes four corners having the lateral radius of curvature.

18. A method of forming an integrated circuit, comprising:
    forming a source region and a drain region spaced apart and extending into a semiconductor layer having a first conductivity type, the source region and the drain region having an opposite second conductivity type;
    forming a gate electrode extending between the source and the drain regions; and
    forming a dielectric layer between the gate electrode and the semiconductor layer, the dielectric layer including a first portion having a first thickness in contact with the semiconductor layer, and a second portion with a greater second thickness over the semiconductor layer, the second portion including:
a lateral perimeter that surrounds the source region and includes a first linear section extending over the semiconductor layer and between the source region and the drain region along a first direction;
a second linear section extending over the semiconductor layer along a different second direction; and
a fillet at an intersection of the first and second linear sections.

* * * * *